US007855101B2

(12) United States Patent
Furman et al.

(10) Patent No.: US 7,855,101 B2
(45) Date of Patent: Dec. 21, 2010

(54) LAYER TRANSFER PROCESS AND FUNCTIONALLY ENHANCED INTEGRATED CIRCUITS PRODUCED THEREBY

(75) Inventors: Bruce K. Furman, Poughquag, NY (US); Sampath Purushothaman, Yorktown Heights, NY (US); Muthumanickam Sankarapandian, Yorktown Heights, NY (US); Anna Topol, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/544,226

(22) Filed: Aug. 20, 2009

(65) Prior Publication Data

US 2010/0081232 A1  Apr. 1, 2010

Related U.S. Application Data

(62) Division of application No. 11/746,680, filed on May 10, 2007, now abandoned.

(51) Int. Cl.
H01L 21/50  (2006.01)
(52) U.S. Cl. .............................. 438/107; 257/E21.499
(58) Field of Classification Search .......... 257/E23.141, 257/E23.142, E23.145; 438/637, 107, 113
See application file for complete search history.

(56) References Cited

U.S. PATENT DOCUMENTS

| 4,939,568 | A | | 7/1990 | Kato |
| 5,250,460 | A | * | 10/1993 | Yamagata et al. ........... 438/458 |
| 5,277,748 | A | * | 1/1994 | Sakaguchi et al. .......... 438/406 |
| 5,405,802 | A | * | 4/1995 | Yamagata et al. ........... 438/459 |
| 5,679,475 | A | * | 10/1997 | Yamagata et al. ........... 428/698 |
| 5,856,229 | A | | 1/1999 | Sakaguchi |
| 6,100,165 | A | | 8/2000 | Sakaguchi |
| 6,121,112 | A | * | 9/2000 | Sakaguchi et al. .......... 438/406 |
| 6,140,209 | A | | 10/2000 | Iwane |
| 6,150,239 | A | | 11/2000 | Goesele |
| 6,190,937 | B1 | | 2/2001 | Nakagawa |
| 6,211,038 | B1 | * | 4/2001 | Nakagawa et al. .......... 438/409 |
| 6,258,698 | B1 | | 7/2001 | Iwasaki |
| 6,306,729 | B1 | | 10/2001 | Sakaguchi |
| 6,309,945 | B1 | | 10/2001 | Sato |
| 6,320,228 | B1 | | 11/2001 | Yu |
| 6,350,702 | B2 | | 2/2002 | Sakaguchi |
| 6,661,098 | B2 | | 12/2003 | Magerlein |
| 6,732,908 | B2 | | 5/2004 | Furman |
| 6,765,301 | B2 | | 7/2004 | Wu |
| 6,819,000 | B2 | | 11/2004 | Magerlein |
| 7,042,753 | B2 | | 5/2006 | Horiguchi |
| 7,190,068 | B2 | | 3/2007 | Hackitt |
| 7,622,363 | B2 | * | 11/2009 | Yonehara et al. ............ 438/458 |
| 2003/0060034 | A1 | * | 3/2003 | Beyne et al. ................. 438/618 |
| 2008/0272497 | A1 | * | 11/2008 | Lake .......................... 257/774 |

OTHER PUBLICATIONS

Auberton-Herve et al., "SMART-CUT® : The basic fabrication process for UNIBOND® SOI wafers", Mat. Res. Soc. Symp. Proc., vol. 446, pp. 177-186 (1997) or IEEE Trans Electron Devices, Mar. 1997.

* cited by examiner

Primary Examiner—Thao P. Le
(74) Attorney, Agent, or Firm—Daniel P. Morris; Robert M. Trepp

(57) ABSTRACT

A structure for a semiconductor components is provided having a device layer sandwiched on both sides by other active, passive, and interconnecting components. A wafer-level layer transfer process is used to create this planar (2D) IC structure with added functional enhancements.

14 Claims, 10 Drawing Sheets

Thinning of Silicon and its Functionalization

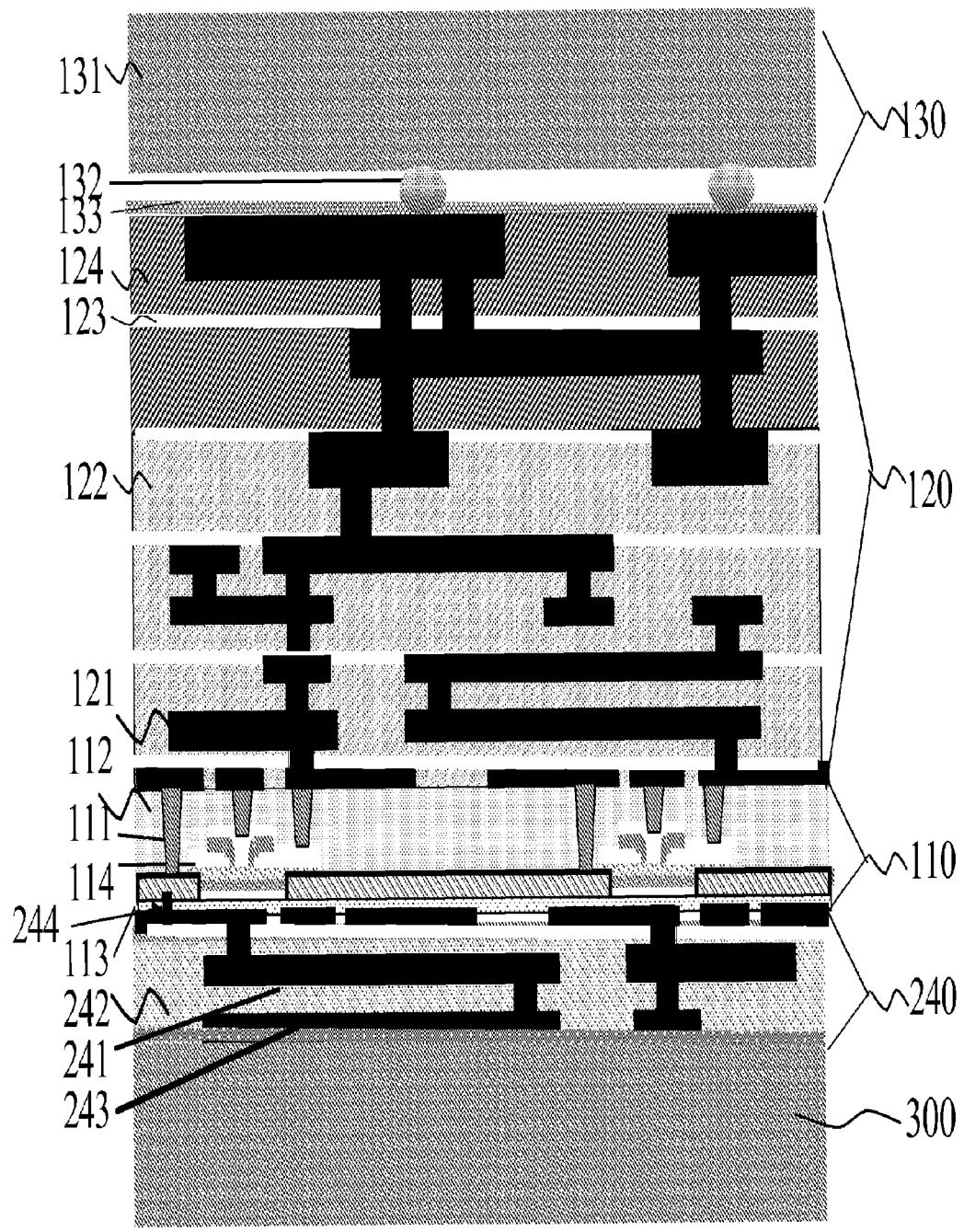
Figure 2. 2D IC with Back Side Functional Elements

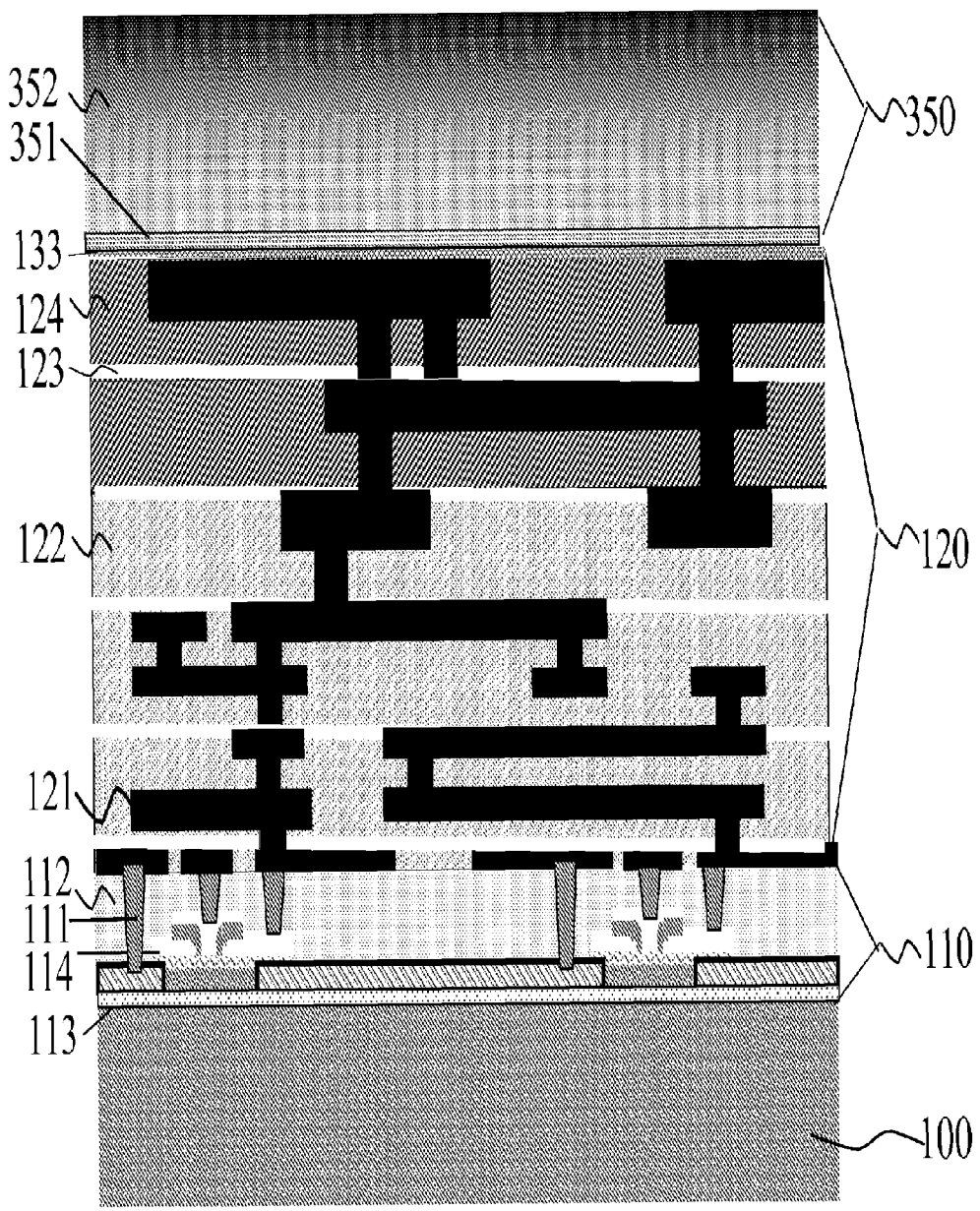
Figure 3a. Attachement of the Carrier Wafer

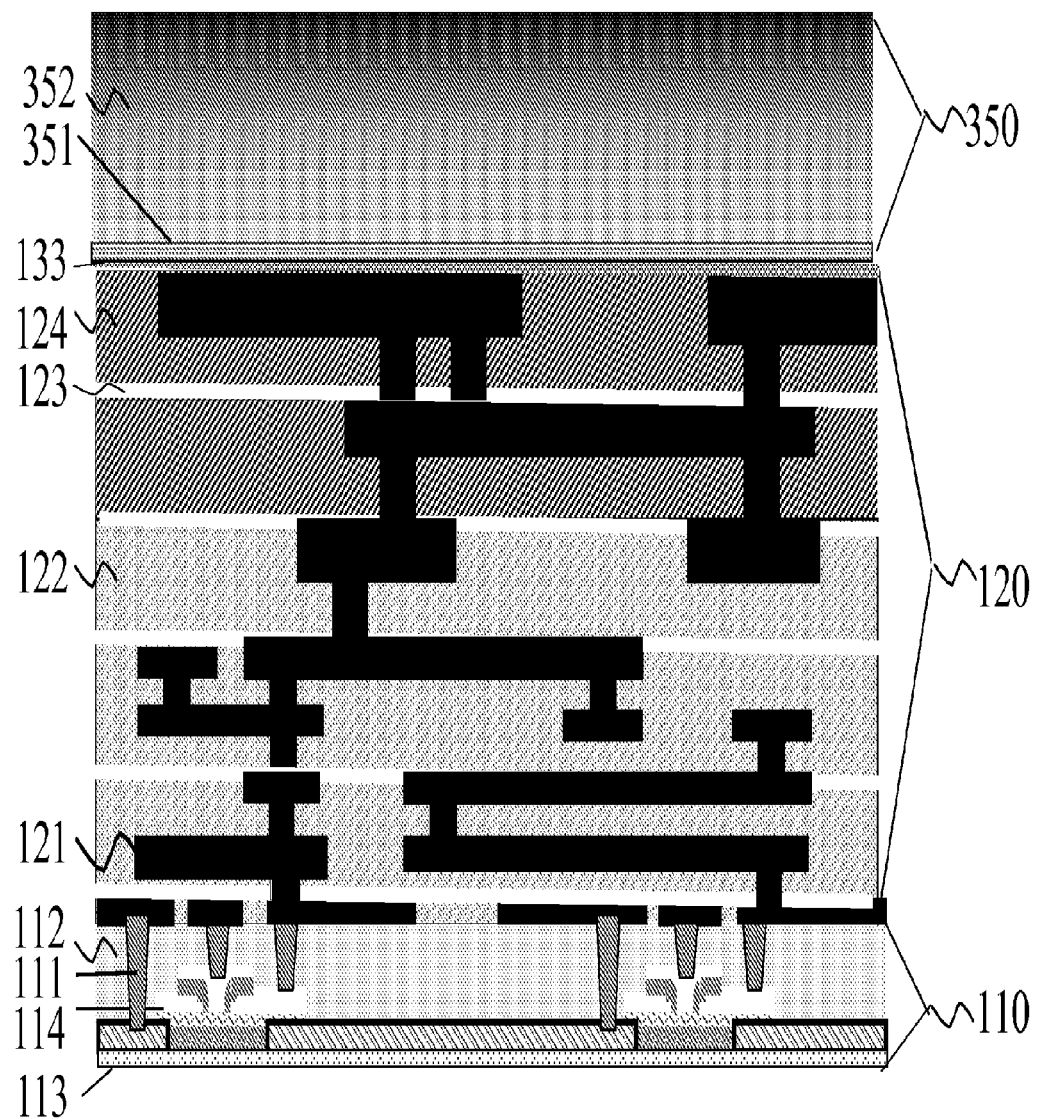
Figure 3b. Removal of the Original Silicon Substrate

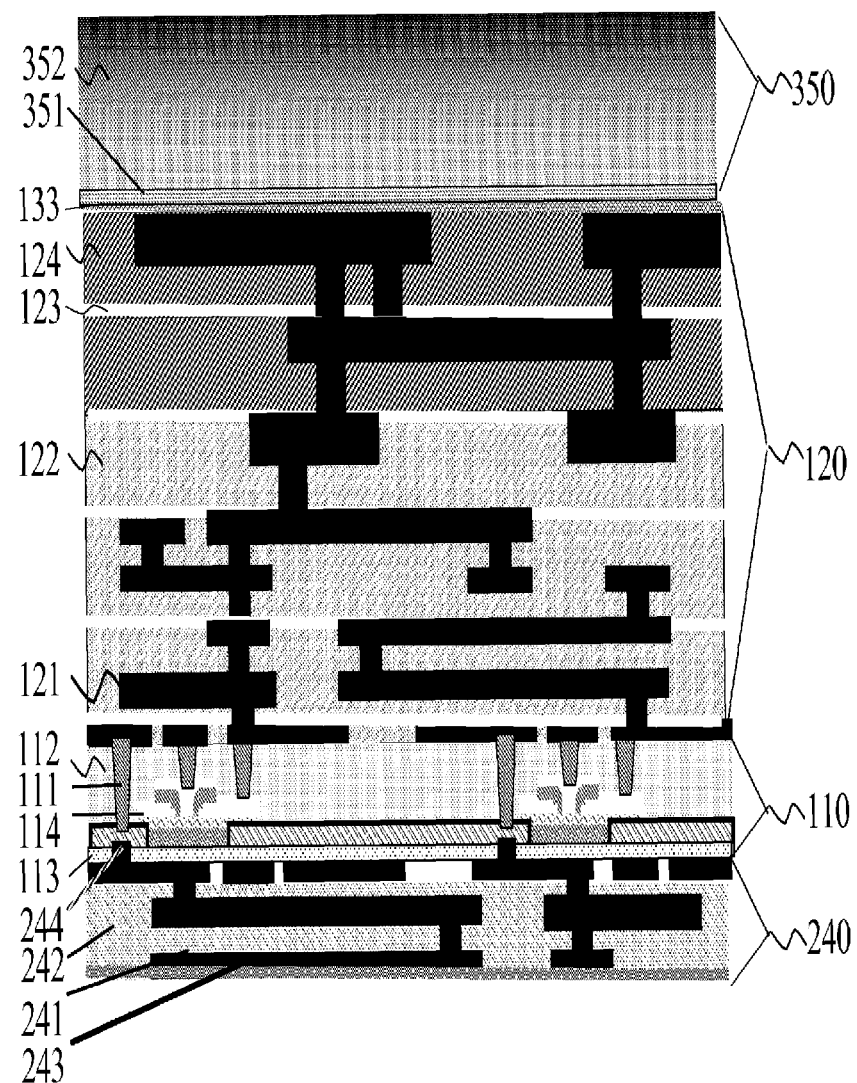
Figure 3c. Formation of Functional Semiconductor Components

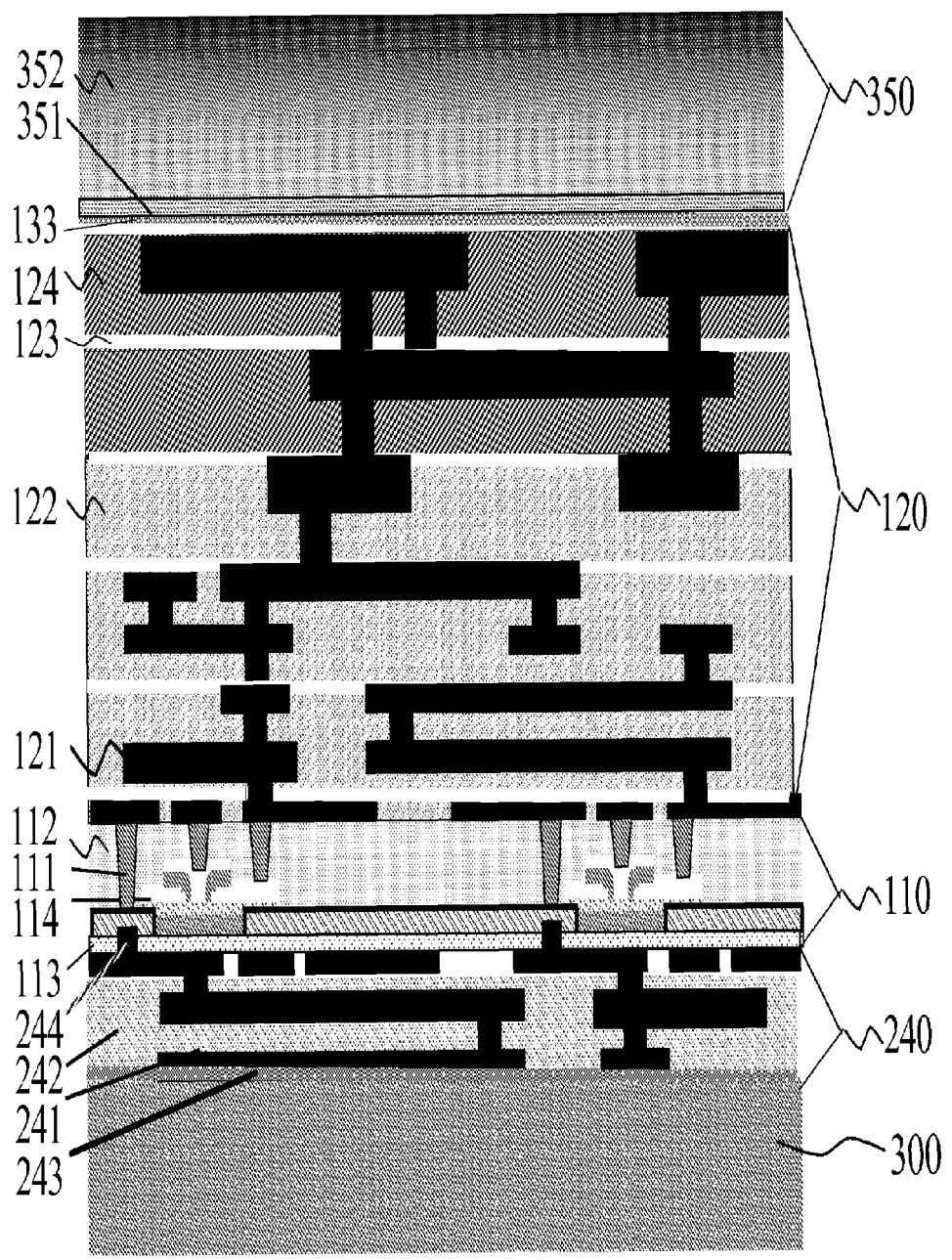
Figure 3d. Attachment of the New Substrate

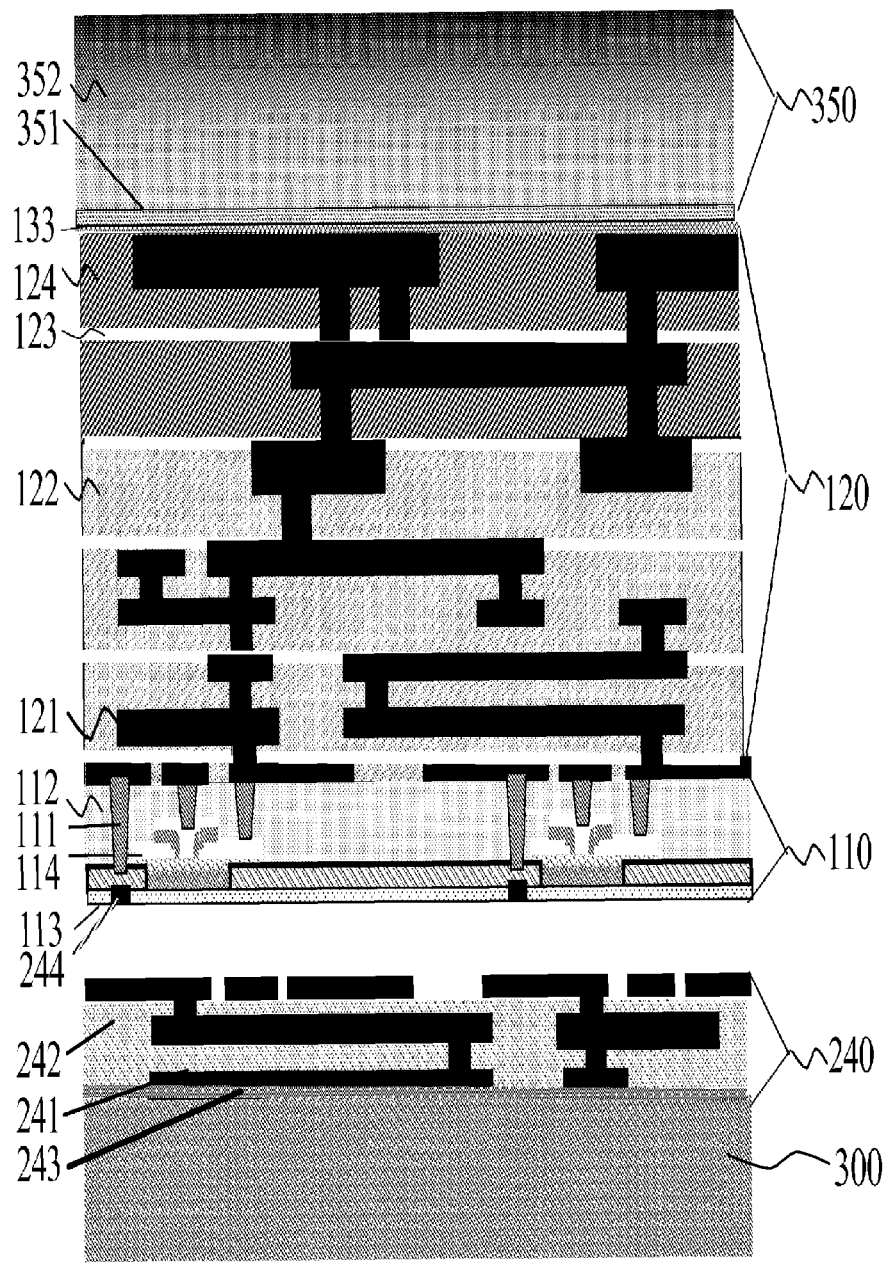
Figure 3e. Parralel Processing of the Receiver & Decal Substrates

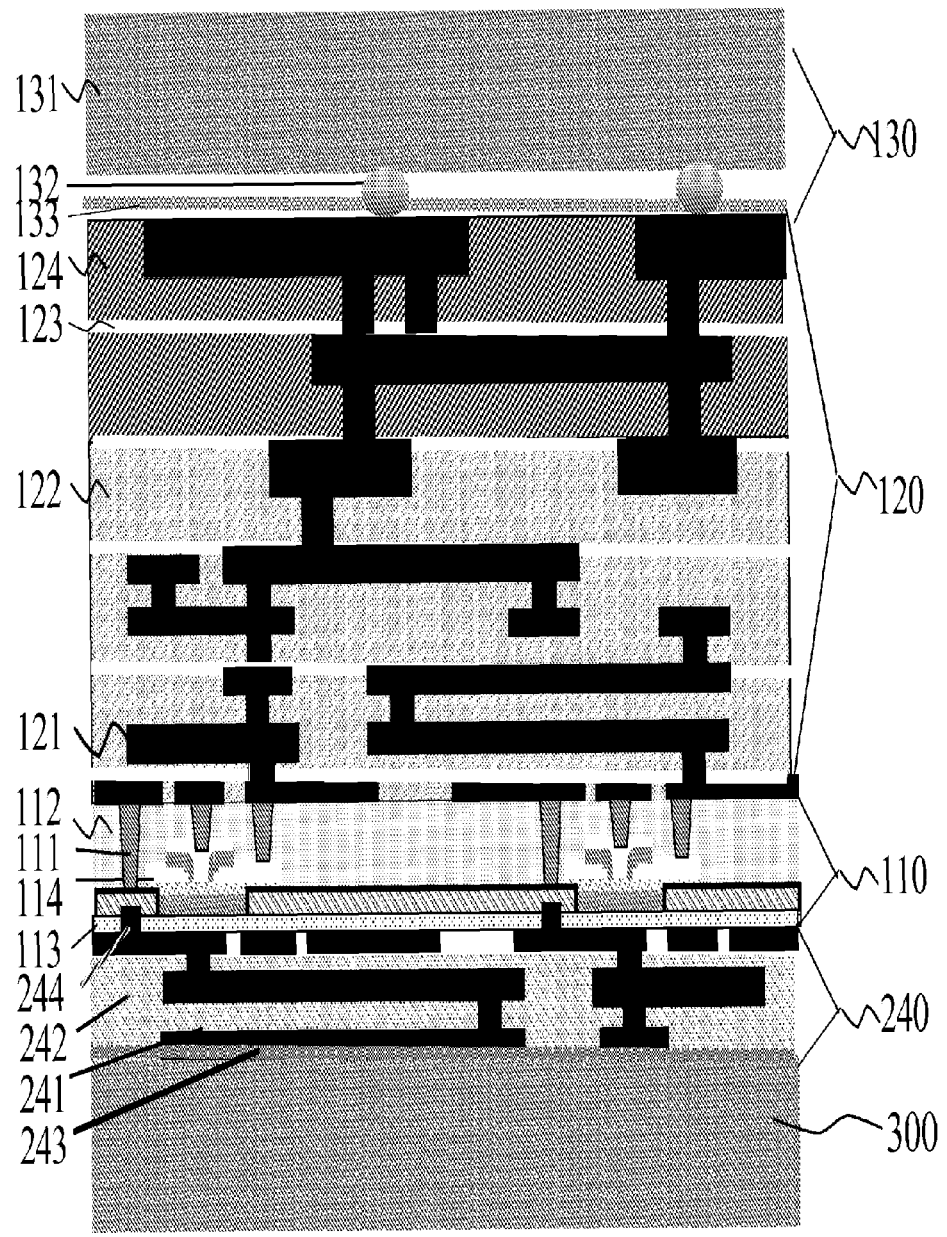
Figure 3f. Removal of Carrier Wafer and Package Attachment

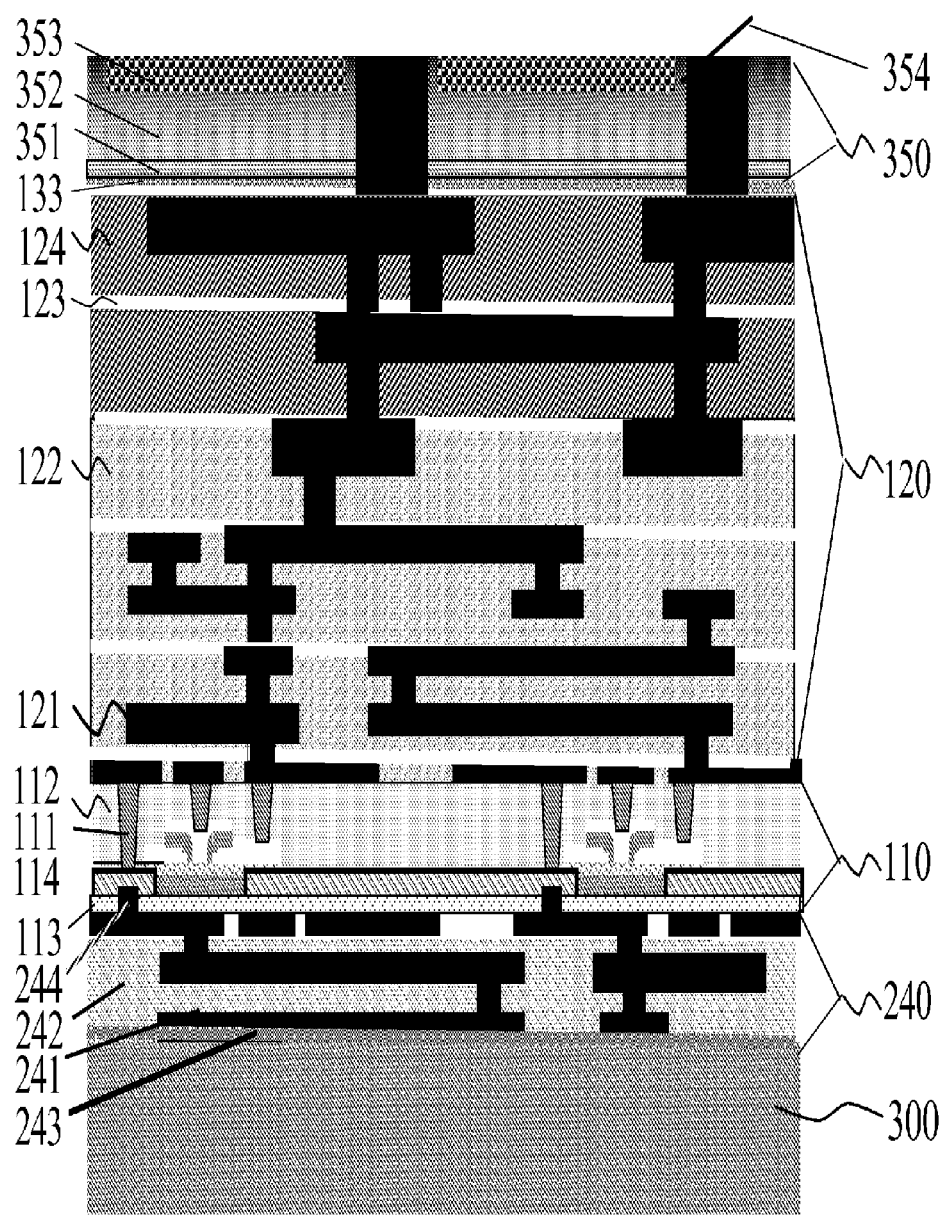
Figure 3g. Thinning of Silicon and its Functionalization

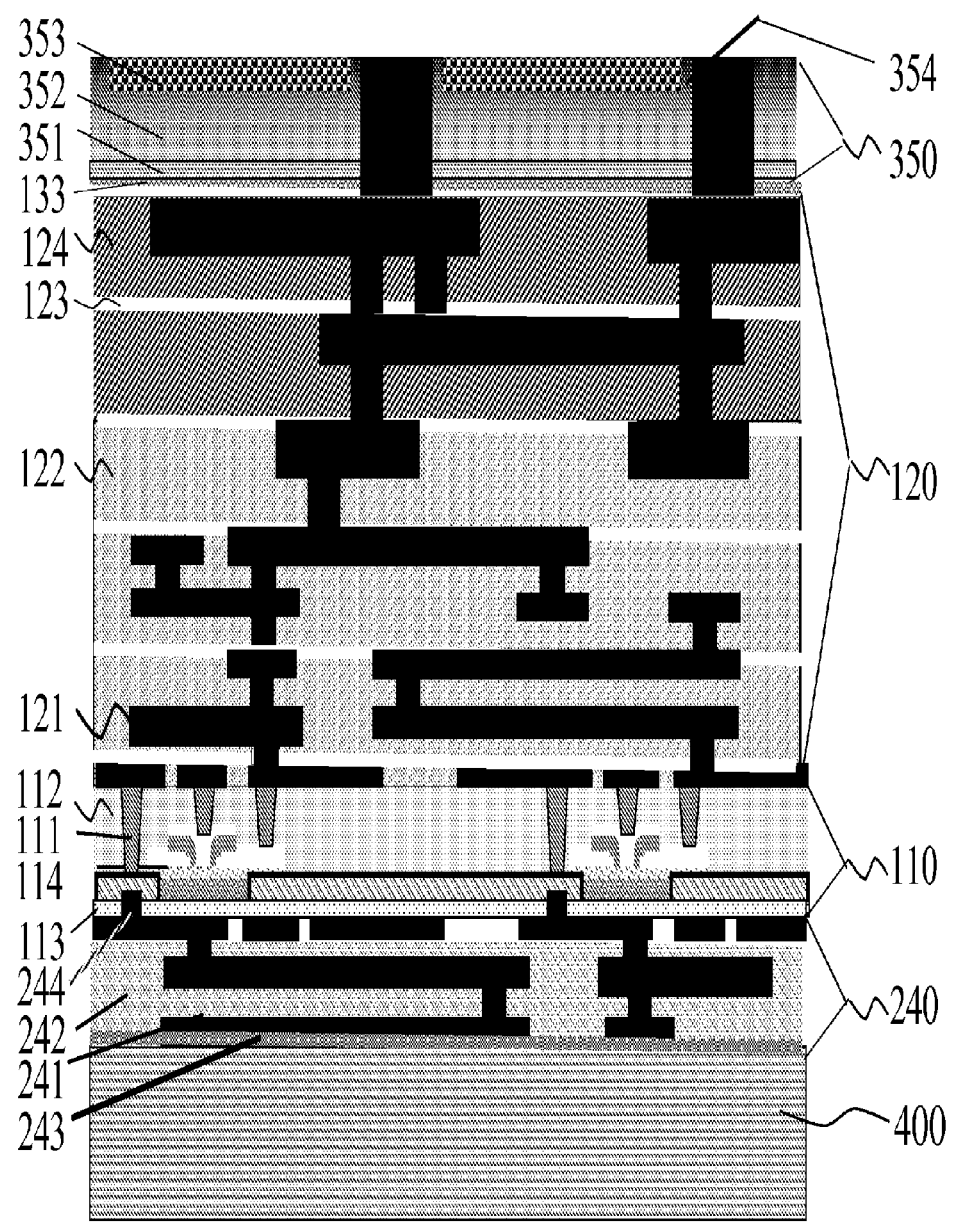
Figure 4. Providing Heat Disipation Capabilities by Implemantaion of Appropriate Heat Sink Substrate

LAYER TRANSFER PROCESS AND FUNCTIONALLY ENHANCED INTEGRATED CIRCUITS PRODUCED THEREBY

This application is a divisional application of application Ser. No. 11/746,680 filed May 10, 2007 now abandoned of which the benefit of the earlier filing date is claimed.

FIELD OF THE INVENTION

The present invention relates to the three dimensional integration of circuit components into functionally enhanced structures using wafer-level layer transfer process based on the incorporation of added functional elements such as new wiring and placement schemes for interconnection of semiconductor components.

BACKGROUND OF THE INVENTION

Interconnect challenges for future microprocessors and other high performance chips arise from the continued push to lower k-effective of interlevel dielectric materials, higher aspect ratio for all wiring levels, and increasing number of metalization layers. At this point the back-end-of-the-line (BEOL) consists of as many as ten metalization levels that contain wires to provide interconnections for signal, clock, power, repeaters, devices, decoupling elements, etc.

Optimization of the microelectronic interconnects is critical for high performance, minimizing the energy dissipation, and maintaining a high level of signal integrity. However, as future interconnects shrink in dimension to allow gigascale integration, the signal delay and the signal fidelity problems associated with the interconnects become significant limiters of the overall system performance (e.g., maximum supportable chip clock frequencies or via blockage due to the need of a large number of vias to connect the multiplicity of wiring levels).

Since changes in system architectures of the planar CMOS IC technology do not achieve a significant performance yield increase per year, and further increase of the number of the interconnect levels raises significant reliability questions, new solutions become a necessity if significant improvements of planar CMOS technology are to be achieved in future IC generations.

Improved performance at a system level can also be achieved by changing the systems architecture. This solution comes at a high cost and is very time consuming as every new generation of products has to be redesigned and verified. Changes in architecture are difficult as they encompass a span of many critical building blocks including: memory and logic, routing, hierarchy, etc.

Therefore, it has been realized that there will be a slow down in the rate of performance improvements for new generations relative to the famous Moore's law of microprocessors if one were to depend on planar architecture alone.

To overcome the limitations of the fully planar integration schemes a variety of three-dimensional (3D) integration and packaging techniques are being evaluated in the art. The main considerations behind the use of 3D Integration are: minimization of the wire length, incorporation of new processes that are currently limited by conventional planar technology, and implementation of related design flexibility including new system architectures. All of which would allow significantly reduced interconnect delay as well as enable mixed system integration to increase both performance and functionality.

At this point 3D wafer-scale integration is a relatively new technology and further investigations including methodologies for reliable etching, cleaning, filling, aligning, bonding integrity, wafer-scale planarity, and integration with active circuits still have to be demonstrated. 3D integration based on stacking of wafer-level device layers has been a main focus of 3D IC technology. This process includes fabrication of each component on a separate wafer with its optimized processing technology, followed by aligning, bonding, and vertical interconnection of the wafers to build a new high functionality system.

The proposed 3D IC solutions show a great potential for future microprocessor generations. However the cost/benefit balance is likely to be favorable only for mature technology elements as in order to implement them in a 3D stacked IC solution reliability and high yields of individual elements along with very high bonding yields need to be realized. In addition, to fully utilize the capability of the 3D technology architectural changes at the micro and macro level of the system need to be implemented. Hence the time of clear insertion of 3D IC in the semiconductor technology road map is not well defined. Therefore, solutions in which some of the elements of the 3D integration schemes can be implemented with only small changes to the current ICs technology offerings to achieve performance and cost benefits are very desirable.

SUMMARY OF THE INVENTION

The present invention pertains to the design, fabrication, and the resulting structures that enable enhanced functionality of semiconductor elements, such as devices and interconnects, using a judicious combination of sequential build up of layers and a layer transfer process. More specifically it overcomes the difficulties associated with the interconnect challenges arising form the continued push to increase the number of metalization layers with higher aspect ratio for many of the wiring levels, and related design issues, as it provides an enhanced 2D IC scheme (referred to hereafter as 2D+) based on wafer-level layer transfer process and a sequential layer wise build compatible with current CMOS technology.

In particular, it is an object of this invention to provide a supporting structure for integrated planar ICs for high frequency and high speed computing applications. It is further an object of this invention to leverage the know-how of the layer transfer technology to form a complete high density interconnect structure with integrated functional components such as ground connections/networks and power planes providing thermal and electrical "drops" or conducting elements. Finally, this invention provides a low cost of ownership scheme to create integrated structures with enhanced functionality by extending the art in existing semiconductor technology as it is based on wafer level technology.

This invention is of wide applicability since it provides a technique and structure in which functional elements such as wiring levels are added in the form of networks or planes underneath a device layer, more particularly a semiconductor device layer. These added elements enable a new level of electrical as well as thermal components to be easily used to enhance CMOS and other technologies. Additional functional elements to enable MEMS, optoelectronics and biotechnology can also be added above or below the device layer to achieve hybrid multifunctional systems currently not feasible by conventional art of fabrication in CMOS technology.

These objects and the associated preferred embodiments are described in detail below along with illustrative figures listed herein.

BRIEF DESCRIPTION OF THE DRAWINGS

The inventions described herein are explained in more detail below with reference to the accompanying drawings, in which:

FIG. 2. Schematic diagram of the novel 2D+CMOS IC structure representing a design related to the present invention in which the functionality and performance of the structure shown in FIG. 1 is enhanced by placing functional elements on both sides of the semiconductor device layer. Functional elements illustrated are BEOL wiring elements, hence allowing for optimization of the signal routing, power distribution and clock signal distribution and the like to and from the device layer in the structure.

FIGS. 3a through 3g. Schematic illustration of the current inventive process for the creation of the 2D+CMOS IC with enhanced functionality shown after the following steps:

FIG. 3a. Attachment of the carrier substrate to the original substrate with a CMOS structure including a semiconductor device layer and interconnect elements.

FIG. 3b. Removal of the original Si substrate to expose the bottom surface of the device structures for further processing.

FIG. 3c. Formation of the additional functional elements on the bottom side of the device layer to create sandwich-like interconnect element/device/functional element system.

FIG. 3d. Attachment of a new foundation substrate to the bottom of the new structure. The foundation substrate is chosen according to the application to provide improved performance of the entire system.

FIG. 3e. Optional parallel processing of elements in the foundation substrate and original substrate through the carrier substrate attachment step.

FIG. 3f. Removal of the top carrier substrate to provide access to the interconnect elements to form input output means to connect with packaging elements.

FIG. 3g. Optional thinning of a Si-based carrier substrate to create an interposer serving as a packaging component with added functionality.

FIG. 4. Schematic representation of an inventive structure providing cooling and heat dissipation capabilities incorporated by transfer onto heat sink-based foundation substrate or substrate with heat-spreading components. Also shown is a Si-based carrier substrate on top of the upper functional element.

DETAILED DESCRIPTION OF PREFERRED EMBODIMENTS

Figure 1:
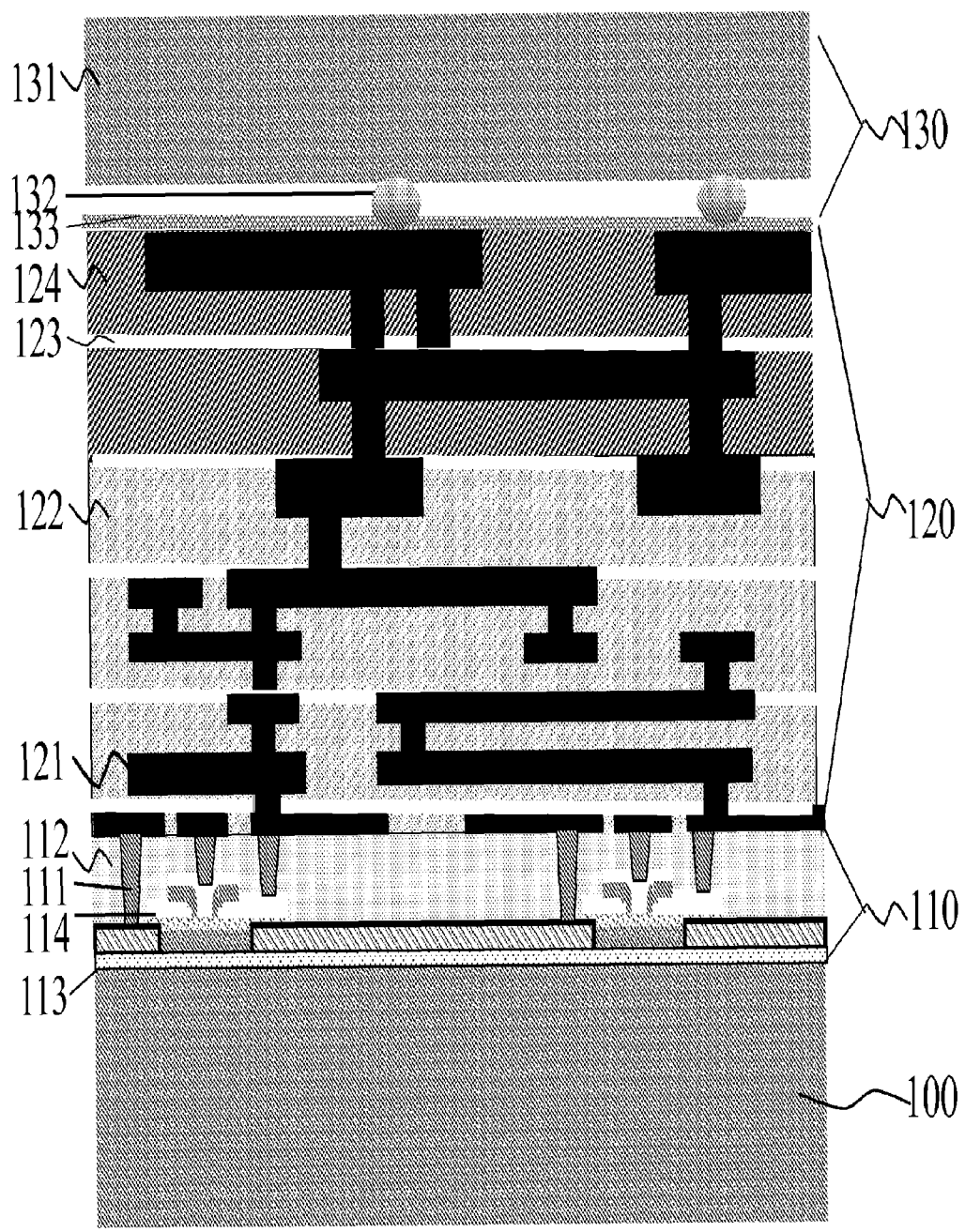
FIG. 1. Schematic diagram of a CMOS IC structure representing integrated front end of the line (FEOL) semicondcutor device layers and back end of the line (BEOL) interconnect functional elements.

The present invention is based on the creation of enhanced 2D CMOS IC structure with functional elements on both sides BEOL IC solution enables improved performance of this novel structure, adds functionality and simplifies processing issues related to multilevel builds by utilizing layer transfer and sequential layer wise build approaches as and where appropriate.

In the first embodiment of the present invention, a CMOS technology structure (see FIG. 1) with its problems related to the via blockage, multi-layer wiring, etc., is transformed into an enhanced planar IC CMOS structure based on creation of a wiring scheme that is disposed on both sides of the device layer (see FIG. 2). This is distinct from the structure illustrated in FIG. 1 which can be described as follows: In FIG. 1 the FEOL structure [110] is fabricated on the substrate [100] and interconnected on the top using BEOL levels [120]. FEOL structure [110] would include the various transistors and the associated contact regions required for such devices. A transition region of local interconnects [111] to connect the device contacts to the BEOL layers above [120] and surrounded by a passivation dielectric [112] is also usually present in these structures. The BEOL interconnection layer [120] further comprises metallic wiring [121] surrounded by dielectric insulation layers [122, 123, 124] which are preferably low in dielectric constant (low k). The FEOL region [110] especially for high performance applications may be built on a silicon-on-insulator (SOI) or other similar substrate in which an embedded layer [113] (such as oxide) may be implemented under the device region [110]. This structure is then interfaced with an appropriate package element [130]. Most often this connection between package carrier [131] and the chip is done via solder ball connections [132].

The Changes to this Structure Taught Under the Present Invention are as Follows:

Upon completion of the proposed combination of the layer transfer process and additional sequential build process (detailed subsequently) the final structure of enhanced planar IC (2D+) is achieved. In this structure shown schematically in FIG. 2, in addition to the already described components in the above FIG. 1 structure, at least one additional functional element, in this case an interconnect element [240], is provided underneath the FEOL level [110]. Interconnect element [240] can itself comprise many layers or components. In other words, element [240] can consist of metalized lines, and functional elements [241] embedded in an appropriate dielectric layer [242] disposed below the device region [110] and on top of the substrate [300], and separated from the substrate by a capping layer [243]. The direct contact to the top device layer stack [110] is made though metal contacts [244]. FIG. 2 shows three metal levels of interconnection in the functional interconnect element [240] for the purpose of illustrating this idea but number and type of layers will depend on the application for which this 2D+IC structure is intended.

FIGS. 3a through 3d are schematic representations of the process utilized to create the structure shown in FIG. 2. This process enables creation of the 2D+IC CMOS structure using only prior art Si CMOS technology compatible processing steps while leveraging the benefits of selected layer transfer process steps. Firstly, as shown in exemplary process beginning with FIG. 3a, a CMOS structure is fabricated on a first substrate [100] and then attached to the carrier substrate [350]. This original CMOS structure consists of Si substrate, a semiconductor device layer stack [110] and a first set of functional elements [120] which in the depicted example are BEOL interconnect elements which in turn are preferably terminated by a capping layer [133]. In this case, the BEOL interconnect elements at least partially connect the circuits present in the semiconductor device layer [110]. This entire structure is attached to a standard carrier wafer [352] such as Si or a glass wafer by means of bonding. Such bonding can be accomplished using fusion bonding (for example silicon oxide to silicon oxide) or by means of intermediate-layer bonding (for example using adhesives). The appropriate bonding material for such process [351] is included between the capping layer and the carrier.

Secondly, as shown in FIG. 3b the first Si substrate [100] is removed to create a decal structure. A combination of polishing, grinding and wet etching techniques known in the art can be used to remove the first substrate [100]. This process is followed by a formation of the second set of functional elements [240] on the newly exposed under side of the device layer to create a sandwich-like system, as presented in FIG. 3c. Taking into consideration the compatibility of silicon substrates with current IC technology and advances in silicon processing (for example lithography, autohandling in high throughput clusters tooling used in reactive etching or deposition, deep via patterning, thinning, and polishing), a silicon-based carrier is the carrier substrate [350] of choice to enable convenient fabrication of the second set of functional elements using state of the art semiconductor fabrication tools. However, polyimide coated glass substrates can also be used, especially since their release process, such as laser ablation, is CMOS-compatible and has been successfully described in the prior art in many packaging applications. In the exemplary illustration in FIG. 3c, the second set of functional elements are shown as a wiring stack that completes the interconnection of the circuits in the semiconductor device layer [110]. Additional functions such as a power distribution, ground shielding, clock signal distribution and the like are also possible by appropriately designing and utilizing this second functional element. Once the processing of the second functional element [240] is accomplished, a foundation substrate [300] chosen according to the final application of the finished 2d+ component is attached to the bottom of the structure by bonding methods described previously (see FIG. 3d). More specifically such bonding could be done using direct bonding or by use of the capping layer [243] which can include needed adhesives.

In one variant of the above process a parallel processing, similar to the 3D assembly approach, can be utilized to shorten the overall fabrication time. In this process, during the time the structure is created on substrate [100] (processes described in FIGS. 3a to 3b) the elements on the foundation substrate [300] are also fabricated. As depicted in FIG. 3e, in this case the foundation substrate [300] is processed with the second functional elements [240] (built in the reverse order when compared to the FIG. 3c build). This approach allows faster turn around for the fabrication of the parts but it may require different metalization schemes to provide the bonded electrical interconnection between the bottom side of the semiconductor device layer and the second functional elements [240]. For example, after the second functional elements are created on the foundation structure, metal contacts [244] are processed, and mated to contacts in a semiconductor device layer [110] and bonded. After bonding, the final structure will look the same as in the previously proposed schemes presented in FIG. 3d. Due to the need to mate the interconnect layer stack [240], and in particular the contacts [244], to corresponding regions in the device element [110] a more stringent alignment methodology would be required for this embodiment as compared to the first embodiment. Thus there is a trade off between faster turn around time processing versus the requirement of tighter alignment tolerance and joining yields. The remaining steps of removing the carrier substrate and creation of input output connection on top are carried out as in the method described earlier.

To release the transferred layers from the carrier substrate [350], a separation process of the carrier has to be performed. The structure after such separation, and after the creation of input output means [132] and attachment to a packaging interface [131] is depicted in FIG. 3f. The separation can be accomplished by a variety of processes, such as aforementioned laser releases of a glass substrate, mechanical grinding, etching or splitting etc of a silicon substrate. In particular, splitting can be accomplished using a tailored interface release layer (having a region with built-in internal stress) and application of ultrasonic waves, thermal stress, oxidation from the edge, insertion of solid wedge, or insertion of fluid wedge methods. Ability to create a reliable release layer using splitting has been well studied in the art and some possible examples cited without attempting to be complete or exhaustive are:

1) Smart-cut® method, based on use of heavy dose hydrogen implantation and a thermal cycle to release the region of the wafer below the implant zone (see for example, Smart-cut® METHOD: Auberton-Herue, Bruel, Aspar, Maleville, and Morieceau, "Smart-Cut®. The Basic Fabrication Process for UNIBOND SOI Wafer". IEEE TRANS ELECTRON Devices, March 1997; U.S. Pat. No. 6,320,228 the teaching of which is incorporated herein by reference)

2) separation by implantation of other elements, such as boron, carbon, phosphorus, nitrogen, arsenic, or fluorine to create a mechanically weaker interface, see for example U.S. Pat. No. 6,150,239 the teaching of which is incorporated herein by reference.

3) Epitaxial Layer TRANsfer method (ELTRAN® or SOI-Epi Wafer™ Technology) based on use of the porous Si layers to define the separation plane, as described in U.S. Pat. Nos. 6,140,209, 6,350,702, 6,121,112, 5,679,475, 5,856,229, 6,258,698, 6,309,945 the teaching of which is incorporated herein by reference) and in relation to the fabrication of semiconductor device such as thin-film crystalline solar cell (U.S. Pat. No. 6,211,038, 6,331,208, 6,190,937 the teaching of which is incorporated herein by reference), and the fabrication of semiconductor article utilizing few layers of porous Si (U.S. Pat. Nos. 6,306,729, 6,100,165 the teaching of which is incorporated herein by reference).

FIGS. 3f and 3g show two possible end results of the functionally enhanced planar IC structures (2D+ICs). FIG. 3f shows the use of a current input output technology such as solder balls [132] to connect to the package interface [131]. FIG. 3g shows a structure made using layer transfer process to create a Si interposer [350], a specialized packaging interface with optimized I/O density, decoupling capacitors, and mechanical robustness for specific applications.

More specifically, the schematic diagram in FIG. 3f depicts the structure obtained after removing the carrier wafer and providing a connection from the set of functional elements [120] to packaging component [131] by C4's or other interconnect elements [132].

Schematic diagram of the functionally enhanced structure in FIG. 3g is based on optional thinning of Si-based carrier substrate [350] of FIG. 3d to create an interposer serving as a packaging component. In this case, substrate [350] is predisposed with integrated passive circuit elements [353] and through contact elements [354] for example before it is attached the original wafer [100] in the step shown in FIG. 3a. Such elements can be fabricated, for example, using the prior art method described in U.S. Pat. No. 6,962,872 (the teaching of which is incorporated herein by reference) by some of the present authors. Incorporation of such a structure would enable integration of passive circuit elements [353], such as capacitors and resistors, within a close proximity to the relevant circuit elements on the chip. More specifically, such design overcomes difficulties associated with the slower access times of discrete passives mounted on the microelectronic chip packages. Such a solution provides a low inductance and low resistance integration of active circuit elements with passive components as described in U.S. Pat. No. 6,962, 872 (the teaching of which is incorporated herein by reference). In addition, a silicon-based carrier allows a very high chip-to-chip wiring density (<5 micrometer pitch) interconnects to connect chips of different technologies using for example micro joint input/output contacts as described in the prior art U.S. Pat. Nos. 6,819,000, 6,661,098 and 6,732,908 (the teaching of which is incorporated herein by reference) held by the present assignee. The added functionality does not have to be limited to passive components only. By extension of this concept, other optical, mechanical, biochemical and electromechanical circuit elements can be formed on the surface (both top and bottom of the carrier) or in the body of the carrier improving its functionality. For example stacks of memory and logic components can be achieved, or digital, analog, and RF circuits can be placed on different layers. Optical interconnects or microfluidic channels can also be incorporated in this carrier.

Another important aspect of the present inventive structure is that an increased functionality can be accomplished and new circuit design can be implemented providing optimized layout for local and global interconnects and hence assuring shorter clock wiring, faster routing paths for signal propagation, and allowing functional partitioning of the overall system. For example, the new wiring layer underneath the device layer not only provides a new real estate for interconnects hence enabling higher wiring density but it also allows to redesign the wiring hierarchy as to optimize the functionality of the structure. Namely, repeaters, decoupling circuit elements, power and signal lines, can be better utilized as they can now be placed where they are most needed, i.e., closer to the devices or I/O elements.

Another benefit from the implementation of such structure is the ability to create added level of ground connections or power planes. In the integrated circuit layouts the function of the metal planes is to supply current and to provide the return paths for current in wires to the power distribution grids. Therefore the main advantage of being able to create a power network underneath the device layer is that it provides a predictable thermal and electrical propagation path through the regular patterns of "drops" or short vertical connections. Such metal planes can be made with application-specific dimensions creating power networks and can be incorporated with complementing decoupling components such as capacitors.

Another embodiment of this invention relates to the heat dissipation or so called "power issues" of the multilayer system. Since the device layer will no longer be in very close proximity to the bulk of the Si substrate, local heating may be expected, and hence the second functional elements may be chosen to include cooling elements or heat spreading elements. In addition since the 2D+IC structure is based on the layer transfer process such process can be repeated to bring in additional and different functional layers. Namely, additional layers of the heat-sink components can be readily incorporated into the process in the form of heat-dissipating layers, films with patterned thermal-vias, or even cooling-channels for incorporation of fluid or air-cooling systems. Active cooling facilities such as thermoelectric coolers may be added to the structure by the transfer process to provide local cooling of high power density regions. As depicted in FIG. 4 these elements may be incorporated in the bottom foundation substrate [300] or the upper silicon interposer [350]. Most importantly, the added functional components can be optimized to provide high electrical and heat conduction capabilities, namely metal embedded in the relatively good heat dissipating dielectric material can be utilized.

This invention enables double-sided access to a semiconductor device layer by wafer-level layer transfer process. This type of structure was proposed since it uses processes compatible with current CMOS technology and it brings potential performance enhancements to a planar Ics by using selected aspects of 3D layer transfer process to create reliable and mechanically stable multi-layer IC structure. Integration of multifunctional structures with active, passive and interconnecting components is made possible by this invention.

Furthermore, the concepts taught in the present invention can be used to add functionality to other 2D ICs without deviating from the spirit of the invention. For example, the methods can be applied to future optoelectronic, MEMs or biotechnology device structures. In such cases, firstly the type of the material to create the layers can be replaced by other materials such as II-VI and III-V materials for optical components (example: gallium arsenide or indium phosphide) and organic materials, and should be selected according to the specific application. Secondly the functional carrier can be an integral part of complex multifunctional and mixed-technology systems or elements created at the wafer level.

What is claimed is:

1. A method of forming an integrated device structure comprising:
    a) building a semiconductor device layer on a first substrate;
    b) providing a set of first functional elements to connect at least some of the devices in said semiconductor device layer;
    c) attaching a carrier substrate on top of said first functional elements;
    d) removing said first substrate to expose the bottom side of the said semicondcutor device layer;
    e) building a set of second functional elements on said exposed bottom side of said semiconductor device layer including electrical connections to at least some of the devices in said semiconductor device layer;
    f) attaching a foundation substrate to the exposed surface of said second functional elements;
    g) removing said carrier substrate from the top of said first functional elements; and
    h) providing input output connections on the exposed top surface of said first functional elements.

2. A method according to claim 1 wherein said first substrate is selected from the group consisting of silicon, silicon insulator, glass and quartz.

3. A method according to claim 1 wherein said first semiconductor device layer comprises devices made of a material selected from the group consisting of silicon, III-V compounds and II-VI compounds.

4. A method according to claim 1 wherein said first functional elements are selected from the group consisting of interconnect wiring, optical interconnects, microfluidic interconnects and a combination thereof.

5. A method according to claim 1 wherein said carrier substrate is made of a material selected from the group consisting of silicon, glass, quartz and ceramic.

6. A method according to claim 1 wherein said second set of functional elements are selected form the group consisting of interconnect wiring, power distribution wiring, ground planes, clock network wiring and optical interconnects.

7. A method according to claim 1 wherein said second set of functional elements further include means to provide heat dissipation and cooling to said semiconductor device layer.

8. A method according to claim 1 further comprising intermediate layers between said first and said second elements and said semiconductor device layer to provide attributes selected from the group consisting of durable adhesion and bonding, diffusion barrier function, passivation and combinations thereof.

9. A method according to claim 8 wherein said intermediate layers are selected from the group consisting of polyamic acid (PAA)-based polyimides, polyamic ester-based polyimides, pre-imidized polyimides, spin on glasses, silicon oxide, silicon nitride, silicon carbide, silicon carbonitride and combinations thereof.

10. A method of forming an integrated device structure comprising:
   a) building a semiconductor device layer on a first substrate;
   b) providing a set of first functional elements to connect at least some of the devices in said semiconductor device layer;
   c) attaching a carrier substrate on top of said first functional elements;
   d) removing said first substrate to expose the bottom side of the said semicondcutor device layer;
   e) building a set of second functional elements on said exposed bottom side of said semiconductor device layer including electrical connections to at least some of the devices in said semiconductor device layer;
   f) attaching a foundation substrate to the exposed surface of said second functional elements;
   g) partially thinning said carrier substrate;
   h) building through vias and integrated elements in said thinned carrier substrate; and
   i) providing input output means such as solder connections and microjoint connections on said thinned carrier substrate.

11. A method according to claim 10 wherein said first functional elements are selected from the group consisting of interconnect wiring, optical interconnects, microfluidic interconnects and a combination thereof.

12. A method according to claim 10 wherein said second set of functional elements further include means to provide heat dissipation and cooling to said semiconductor device layer.

13. A method according to claim 10 further comprising intermediate layers between said first and said second elements and said semiconductor device layer to provide attributes selected from the group consisting of durable adhesion and bonding, diffusion barrier function, passivation and combinations thereof.

14. A method according to claim 13 wherein said intermediate layers are selected from the group consisting of polyamic acid (PAA)-based polyimides, polyamic ester-based polyimides, pre-imidized polyimides, spin on glasses, silicon oxide, silicon nitride, silicon carbide, silicon carbonitride and combinations thereof.

* * * * *